(12) United States Patent
Rodak

(10) Patent No.: US 9,052,616 B2
(45) Date of Patent: Jun. 9, 2015

(54) DUAL CONTAINMENT SYSTEM HAVING COAXIAL FLEXIBLE TUBES FOR TRANSPORTING A FLUID THROUGH A "ROLLING LOOP" CABLE DUCT

(75) Inventor: Daniel Paul Rodak, Milford, CT (US)

(73) Assignee: ASML Holding N.V., Veldhoven (NL)

(*) Notice: Subject to any disclaimer, the term of this patent is extended or adjusted under 35 U.S.C. 154(b) by 456 days.

(21) Appl. No.: 12/915,632

(22) Filed: Oct. 29, 2010

(65) Prior Publication Data

US 2011/0267590 A1 Nov. 3, 2011

Related U.S. Application Data

(60) Provisional application No. 61/267,683, filed on Dec. 8, 2009.

(51) Int. Cl.
*G03F 7/20* (2006.01)

(52) U.S. Cl.
CPC .................. *G03F 7/70991* (2013.01)

(58) Field of Classification Search
CPC .................................. G03F 7/70991
USPC ........................... 355/30; 138/113
See application file for complete search history.

(56) References Cited

U.S. PATENT DOCUMENTS

| 6,032,699 A * | 3/2000 | Cochran et al. ............... 138/104 |
| 6,183,021 B1 | 2/2001 | Walsh et al. |
| 6,915,179 B2 * | 7/2005 | Emoto .......................... 700/121 |
| 2008/0223471 A1 * | 9/2008 | Guo .............................. 138/113 |

FOREIGN PATENT DOCUMENTS

| JP | 58-132280 U | 9/1983 |
| JP | 61-289633 A | 12/1986 |
| JP | 62-113984 A | 5/1987 |
| JP | 04-145290 A | 5/1992 |
| JP | 11-109649 A | 4/1999 |
| JP | 2005-064229 A | 3/2005 |
| JP | 2009-120259 A | 6/2009 |

OTHER PUBLICATIONS

English-Language Translation of Notification of Reason(s) for Refusal directed to related Japanese Patent Application No. 2010-271351, mailed Aug. 26, 2014; 4 pages.
"Dual Containment Products," Entegris, Inc., 2002; 6 pages.
"FluroLine® Dual Containment Tubing," Entegris, Inc., accessed at http://www.entegrisfluidhandling.com/Default.asp?G=1390&ONID=3137&ON=DCT1000E-750U-750&ln=en, on Oct. 9, 2014; 2 pages.

* cited by examiner

*Primary Examiner* — Chia-How Michael Liu
(74) *Attorney, Agent, or Firm* — Sterne, Kessler, Goldstein & Fox P.L.L.C

(57) ABSTRACT

Disclosed are systems and methods for a fluid transportation system having a first flexible tube with an inner wall. The fluid transportation system also has a second flexible tube with an outer wall. The second tube is located inside the first tube and a standoff is located between the inner wall of the first tube and the outer wall of the second tube. The first flexible tube is configured to transport a first fluid and the second flexible tube is configured to transport a second fluid. The first and second flexible tubes are configured such that the first fluid isolates the second fluid from an ambient environment, and the first fluid can be monitored for leakage.

18 Claims, 15 Drawing Sheets

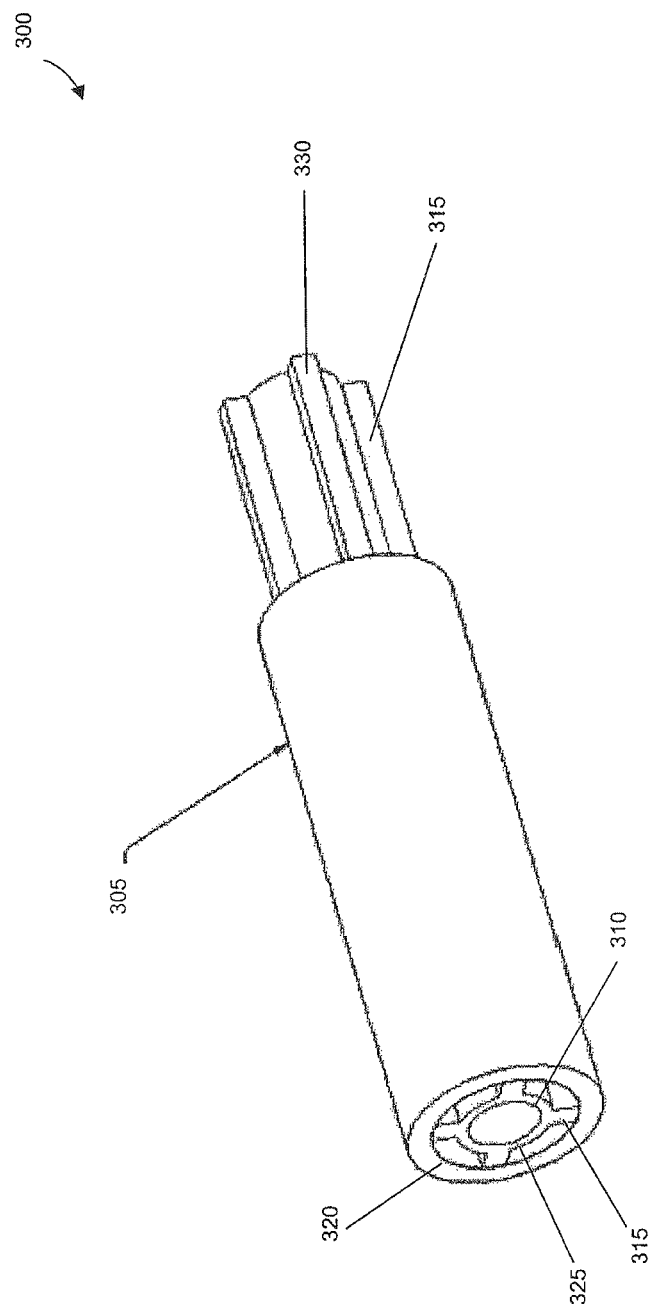

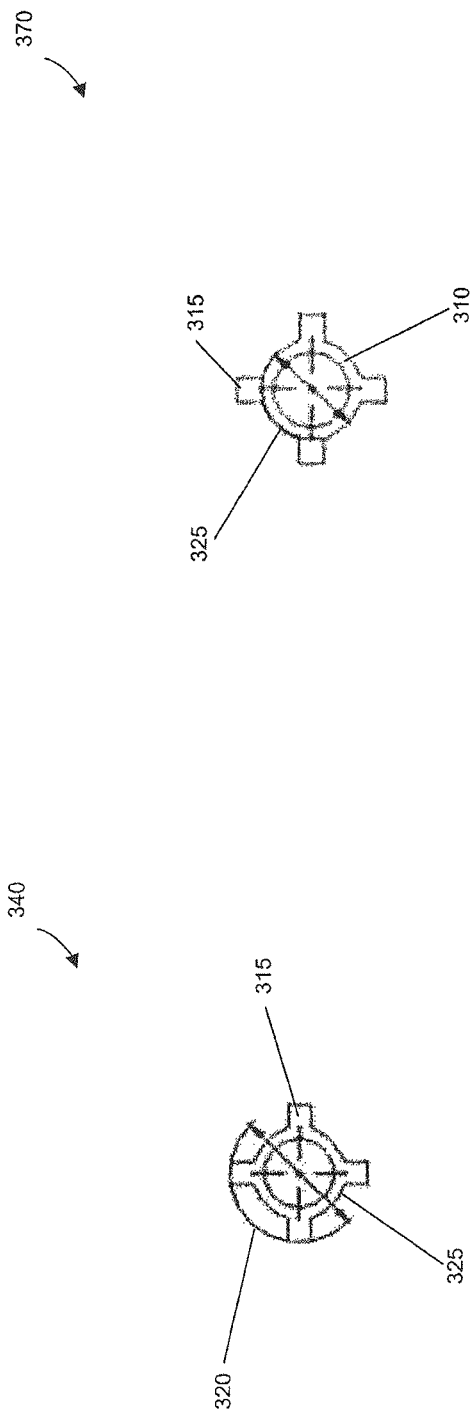

DUAL CONTAINMENT SYSTEM HAVING COAXIAL FLEXIBLE TUBES FOR TRANSPORTING A FLUID THROUGH A "ROLLING LOOP" CABLE DUCT

CROSS REFERENCE TO RELATED APPLICATIONS

This application claims benefit under 35 U.S.C. §119(e) to U.S. Provisional Patent Application No. 61/267,683, filed Dec. 8, 2009, which is incorporated by reference herein in its entirety.

BACKGROUND

1. Field of the Invention

The present invention generally relates to lithography, and more particularly to fluid transport where containment of a primary fluid is of paramount importance.

2. Related Art

A lithographic apparatus is a machine that applies a pattern onto a substrate, usually onto a target portion of the substrate. A lithographic apparatus can be used, for example, in the manufacture of integrated circuits (ICs). In that instance, a patterning device, which is alternatively referred to as a mask or a reticle, can be used to create a circuit pattern formed on an individual layer of the IC. The pattern can be transferred onto the target portion (e.g., comprising part of, one, or several dies) of the substrate (e.g., a silicon wafer). Transfer of the pattern is typically via imaging the pattern onto a layer of radiation-sensitive material (resist) on the substrate. In general, a single substrate will contain a network of adjacent target portions that are patterned. Known lithographic apparatus include steppers, in which each individual target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

Within the lithographic apparatus, hydrogen gas is used for various processes. Hydrogen is hazardous, so for safety concerns, the tubing transporting the hydrogen must be rigid to resist punctures and subsequent uncontrolled release. However, some applications require the hydrogen be transported between a stationary, or static, part of the lithographic apparatus and a moving, or dynamic, part of the lithographic apparatus. In these applications, rigid tubing cannot be used due to the relative motion of the static and dynamic parts. Thus, flexible tubing must be used to accommodate the relative motion.

When using flexible tubing to carry hydrogen, a dual containment tube is used for safety reasons. A dual containment tube has a small inner tube surrounded by a larger tube. The inner tube transports the hydrogen, and the outer tube acts as back-up containment in case the inner tube leaks.

The conventional tubing arrangement is not without problems. Conventional dual containment tubing has an inner tube made of perfluoroalkoxy resin (PFA), and an outer tube made of fluorinated ethylene propylene resin (FEP). These materials are stiff and add resistance to the relative motion of the static and dynamic parts. These materials are also prone to premature failure due to their stiffness, and are not suitable for applications having millions of movement cycles. The stiffness of these materials also provides the smallest conventional dual containment tubing with a minimum bend radius that is too large. The large bend radius leads to kinking of the tubing. The large bend radius also requires the tubing take up excessive volume that necessitates a separate assembly specifically to accommodate the limitations of the conventional tubing. The separate assembly also adds undesirable weight and unnecessary manufacturing cost to the lithographic apparatus. Further, conventional dual containment tubing fittings are not compatible with standard ultra-high purity (UHP) fittings, requiring the use of bulky and heavy adapters to adapt the incompatible fittings.

Therefore, the conventional systems and methods for transporting fluids between the stationary and the moving components suffer from significant disadvantages.

SUMMARY

This section is for the purpose of summarizing some aspects of the present invention and to briefly introduce some preferred embodiments. Simplifications or omissions may be made to avoid obscuring the purpose of the section. Such simplifications or omissions are not intended to limit the scope of the present invention. Consistent with the principles of the present invention as embodied and broadly described herein, the present invention includes improved fluid containment systems and methods. To meet these needs, embodiments of the present invention are directed toward dual containment systems and methods.

For example, an embodiment provides a fluid transportation system having a first flexible tube with an inner wall. The fluid transportation system also has a second flexible tube with an outer wall. The second tube is located inside the first tube and a standoff is located between the inner wall of the first tube and the outer wall of the second tube. The first flexible tube is configured to transport a first fluid and the second flexible tube is configured to transport a second fluid. The first and second flexible tubes are configured such that the first fluid isolates the second fluid from an ambient environment.

As a further example, another embodiment provides a method for communicating a first fluid via a first tube having a first end, a second end, and an inner wall, and for communicating a second fluid via a second tube having a first end, a second end, and an outer wall, where the second tube is located inside the first tube; the first and second tubes are flexible; and a standoff is located between the outer wall of the second tube and the inner wall of the first tube. The method includes creating a first differential pressure between the first and second ends of the first tube. A second differential pressure is created between the first and second ends of the second tube. The first end of the first tube is moved relative to second end of the first tube.

In yet another exemplary embodiment, there is provided a fluid transportation system having a first flexible tube having an inner wall and configured to transport a first fluid. Also provided is a second flexible tube having an outer wall and configured to transport a second fluid. The second tube is located inside the first tube. The system also has a device for standing off the first and second tubes, located between the inner wall of the first tube and the outer wall of the second tube. The first and second flexible tubes are configured such that the first fluid isolates the second fluid from an ambient environment.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

FIGS. 1A and 1B respectively depict reflective and transmissive lithographic apparatuses.

Figure 3D:
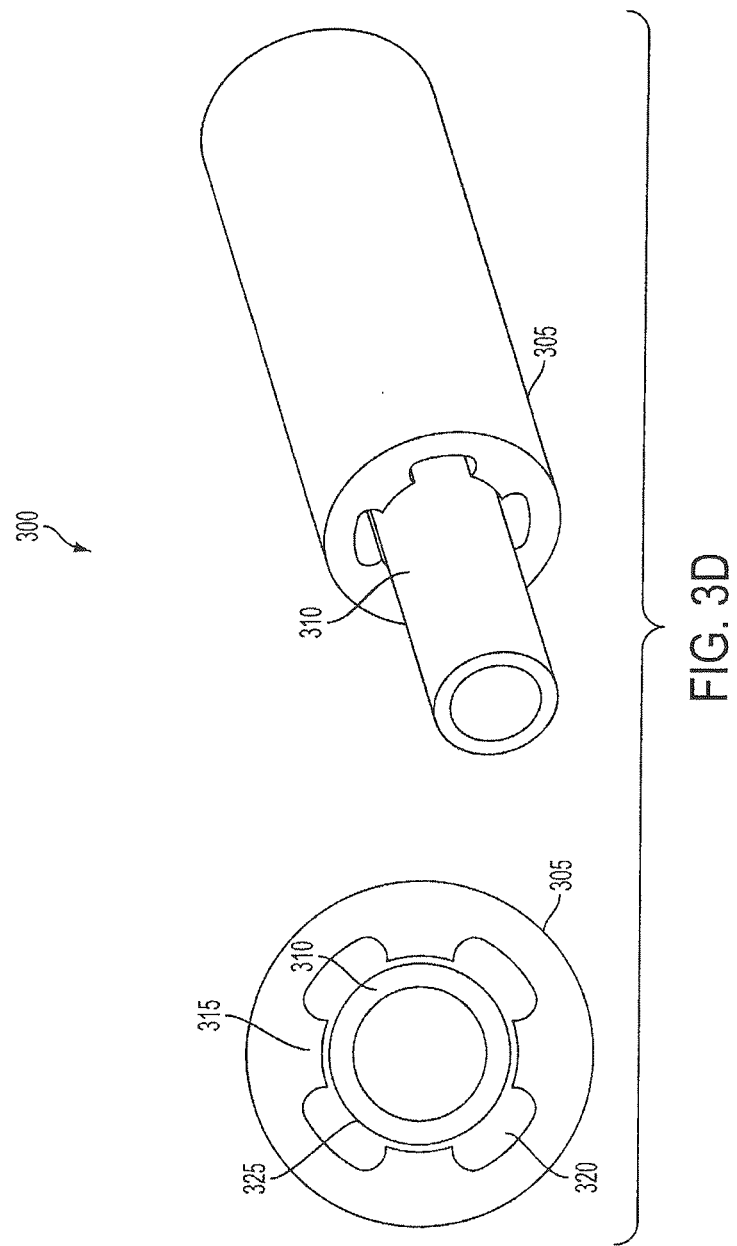
FIG. 3A depicts an example dual-lumen tube assembly.
FIG. 3B depicts an example cross-section of the dual-lumen tube assembly.
FIG. 3C depicts another example cross-section of the dual-lumen tube assembly.
Figure 3E:
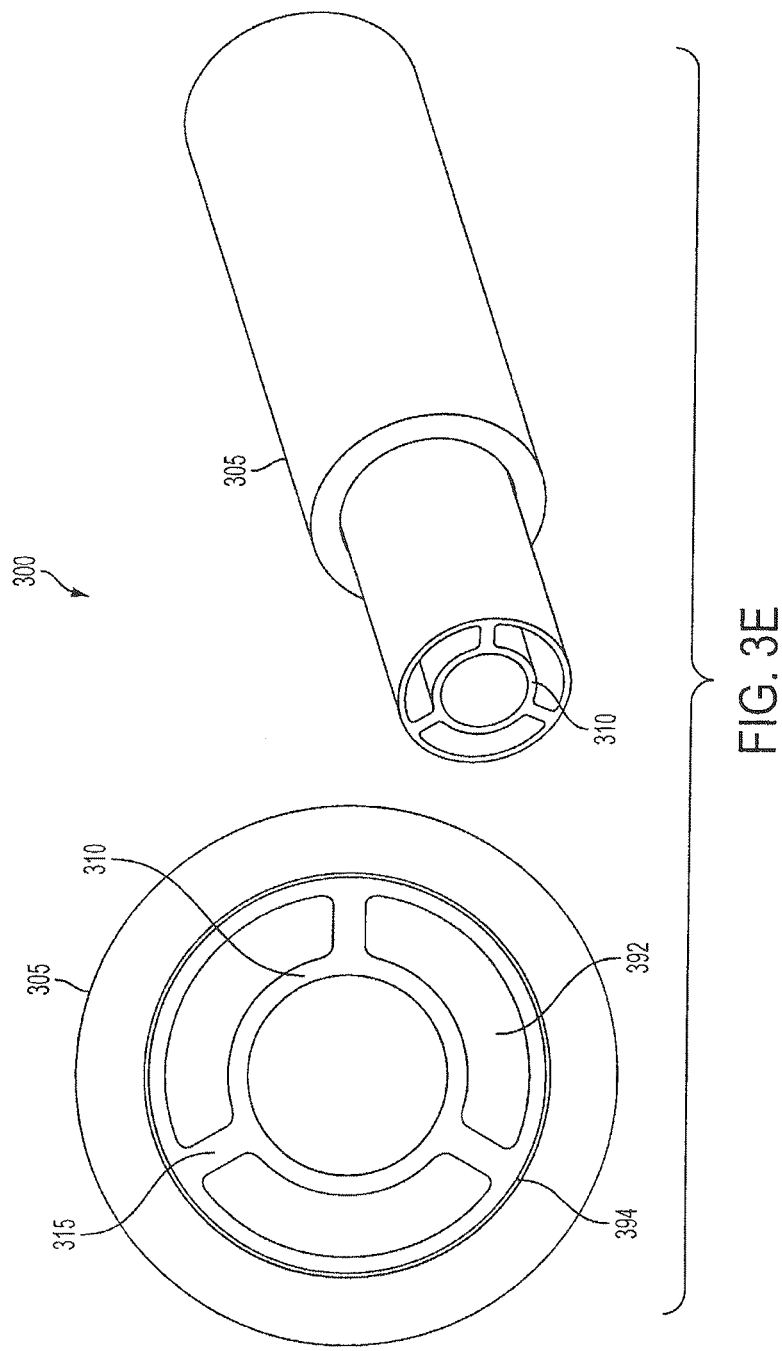
Figure 3F:
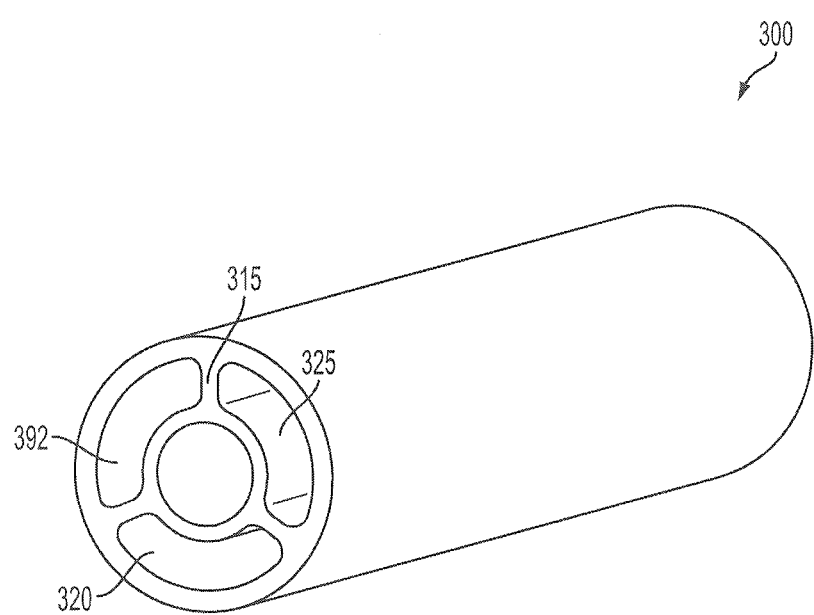

FIG. 3D-F depict example composite dual-lumen tube assemblies.

Figure 4:
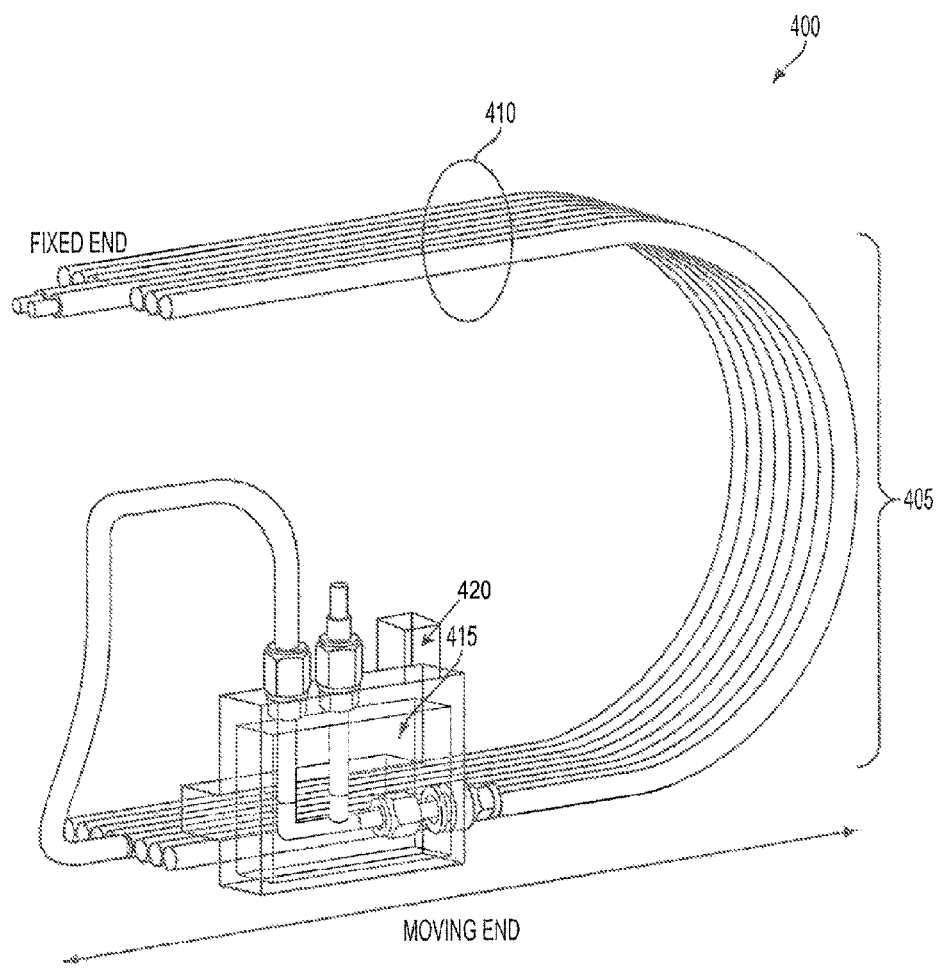

FIG. 4 depicts an example of a dual-containment fluid transportation assembly.

Figure 5:
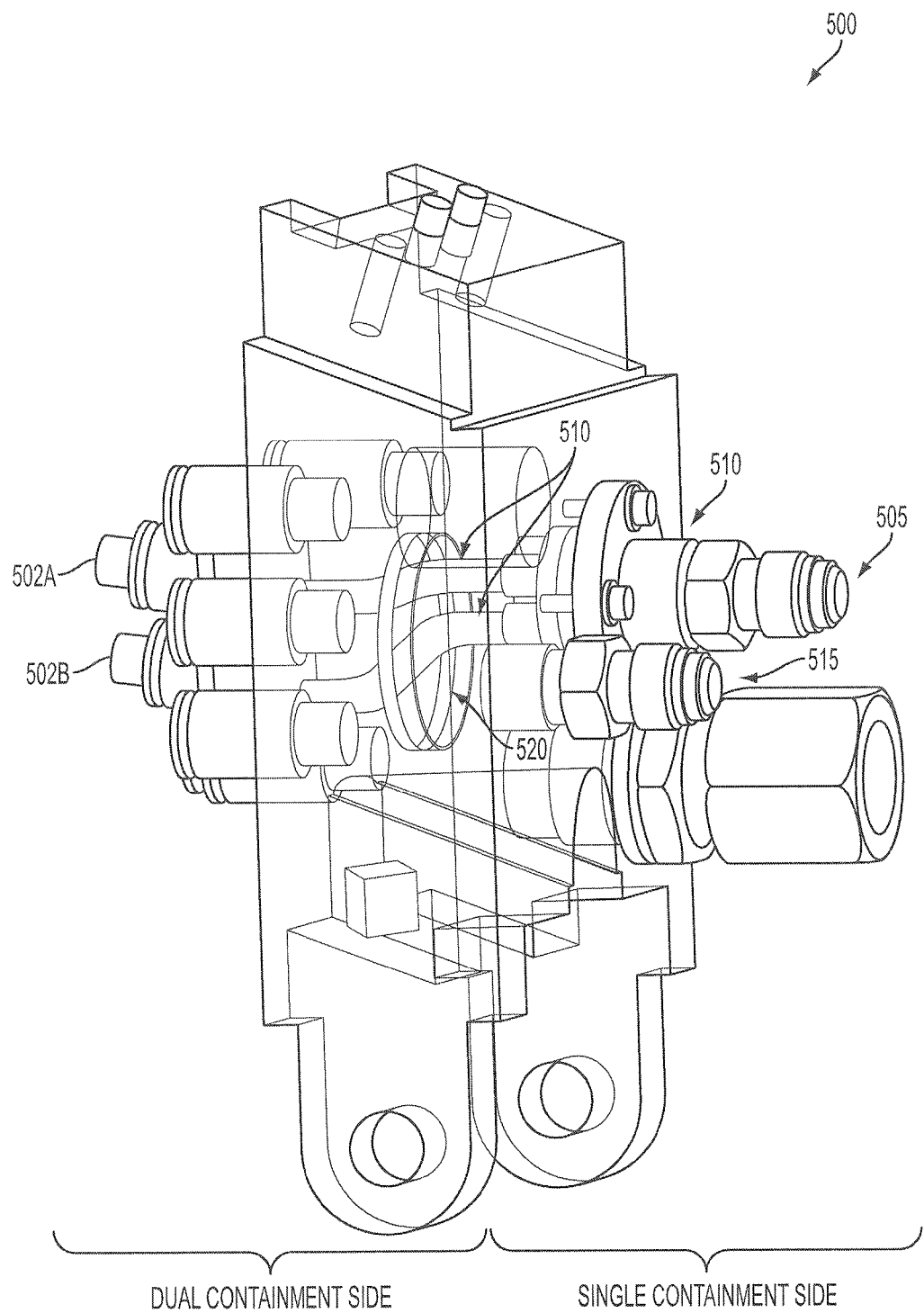

FIG. 5 depicts an example of a static distribution device.

Figure 6A:
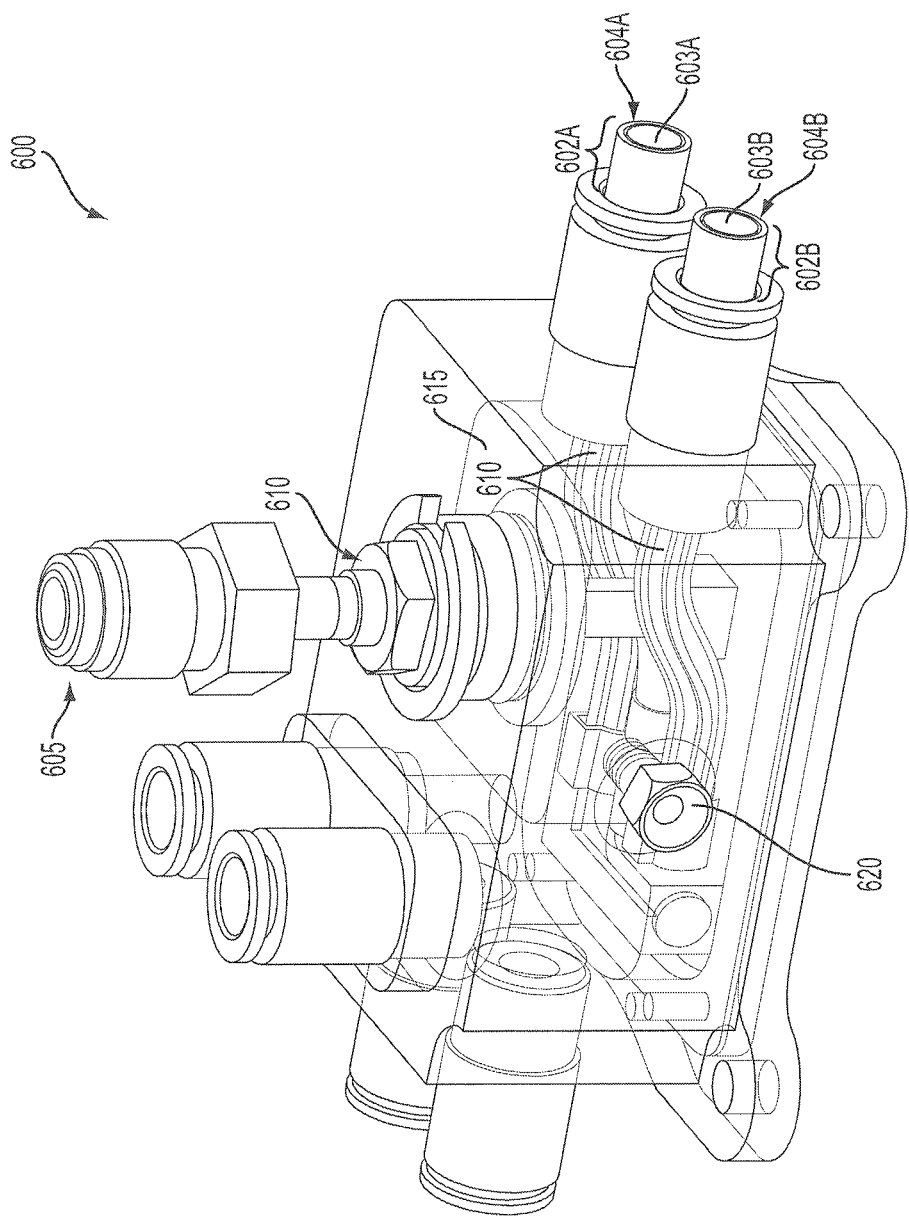

FIG. 6A depicts an example of a dynamic distribution device.

Figure 6B:
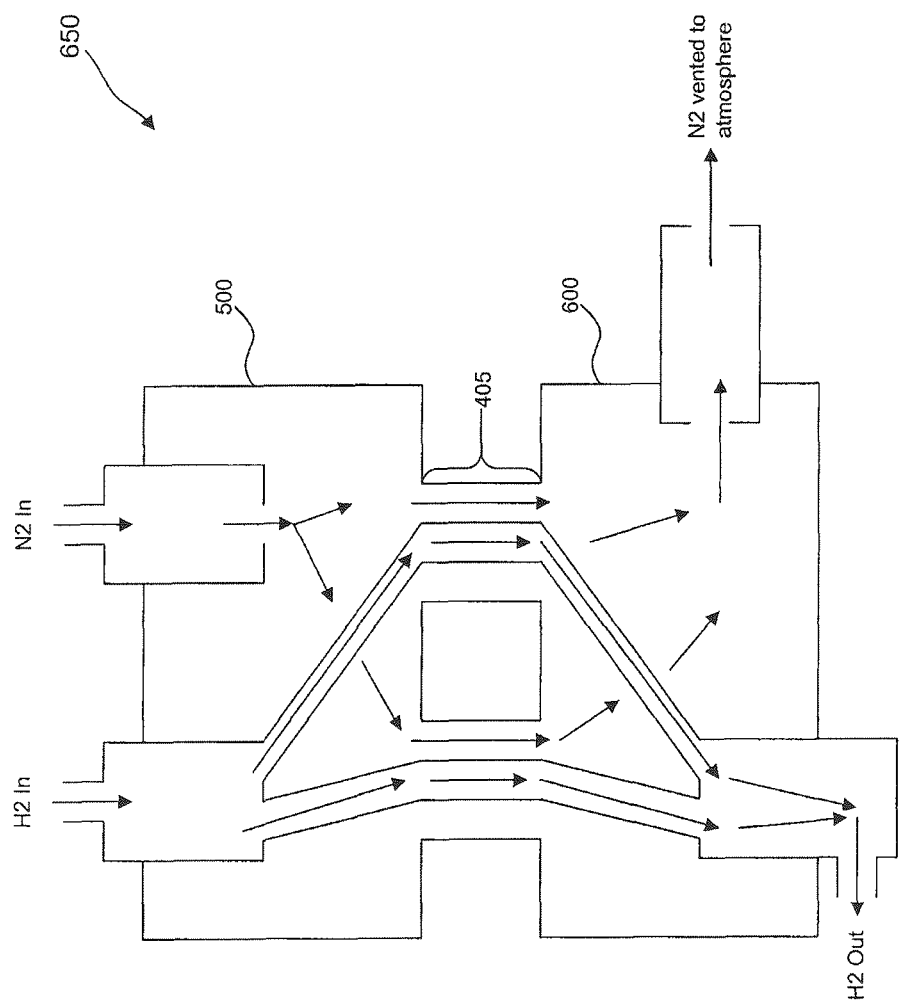

FIG. 6B depicts a schematic of an exemplary embodiment of a dual containment fluid transport system.

Figure 6C:
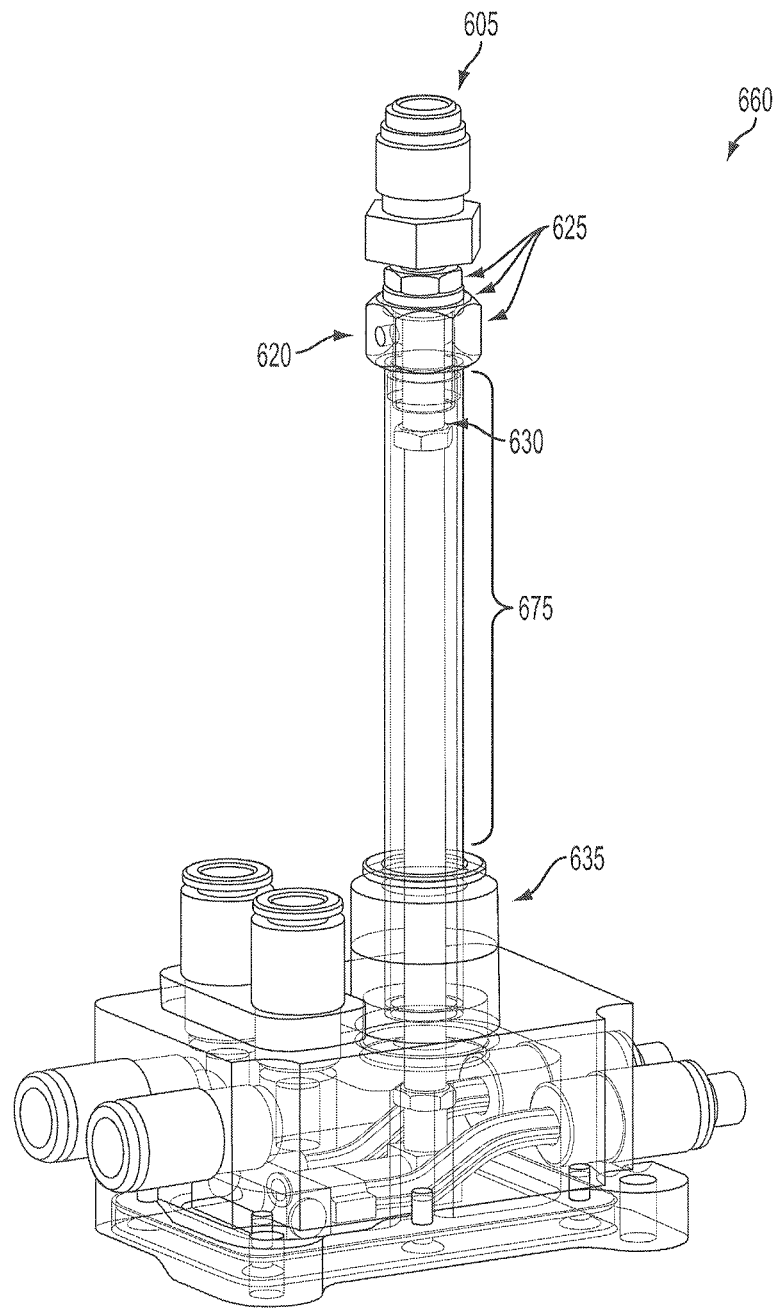

FIG. 6C depicts another example of a dynamic distribution device.

Figure 6D:
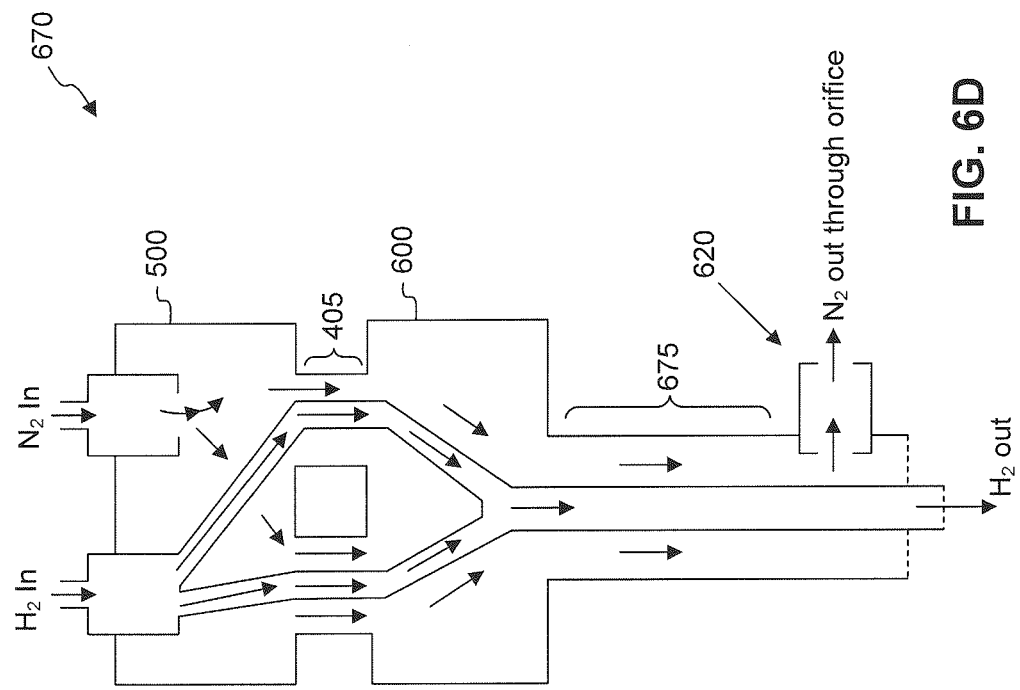

FIG. 6D depicts a schematic of another exemplary embodiment of a dual containment fluid transport system.

Figure 7:
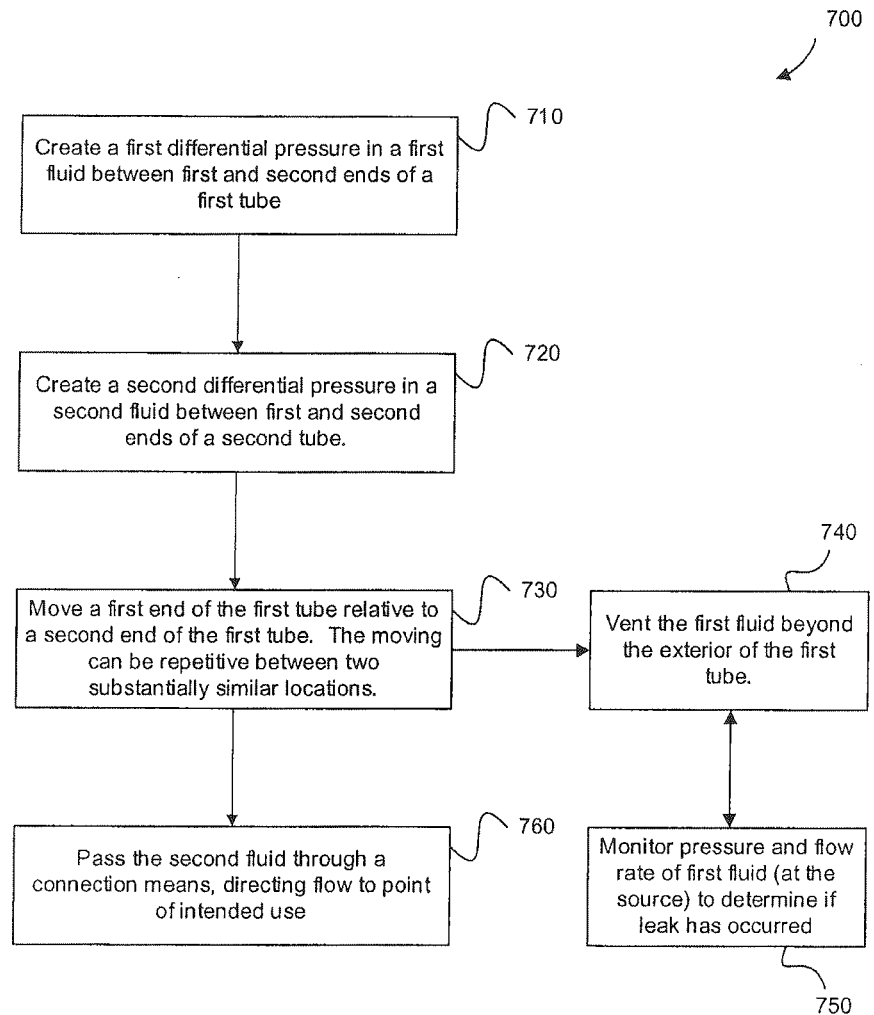

FIG. 7 depicts a flowchart of an exemplary method for communicating fluids.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

I. Overview

The invention will be better understood from the following descriptions of various "embodiments" of the invention. Thus, specific "embodiments" are views of the invention, but each does not itself represent the whole invention. In many cases individual elements from one particular embodiment may be substituted for different elements in another embodiment carrying out a similar or corresponding function. The present invention relates to fluid transportation methods and apparatus. This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments, whether or not explicitly described.

Disclosed are systems and methods for a fluid transportation system having a first flexible tube with an inner wall. The fluid transportation system also has a second flexible tube with an outer wall. The second tube is located inside the first tube and a standoff is located between the inner wall of the first tube and the outer wall of the second tube. The first flexible tube is configured to transport a first fluid and the second flexible tube is configured to transport a second fluid. The first and second flexible tubes are configured such that the first fluid isolates the second fluid from an ambient environment.

Before describing such embodiments in more detail, however, it is instructive to present an example environment in which embodiments of the present invention may be implemented.

II. An Example Lithographic Environment

A. Example Reflective and Transmissive Lithographic Systems

Figure 1A:
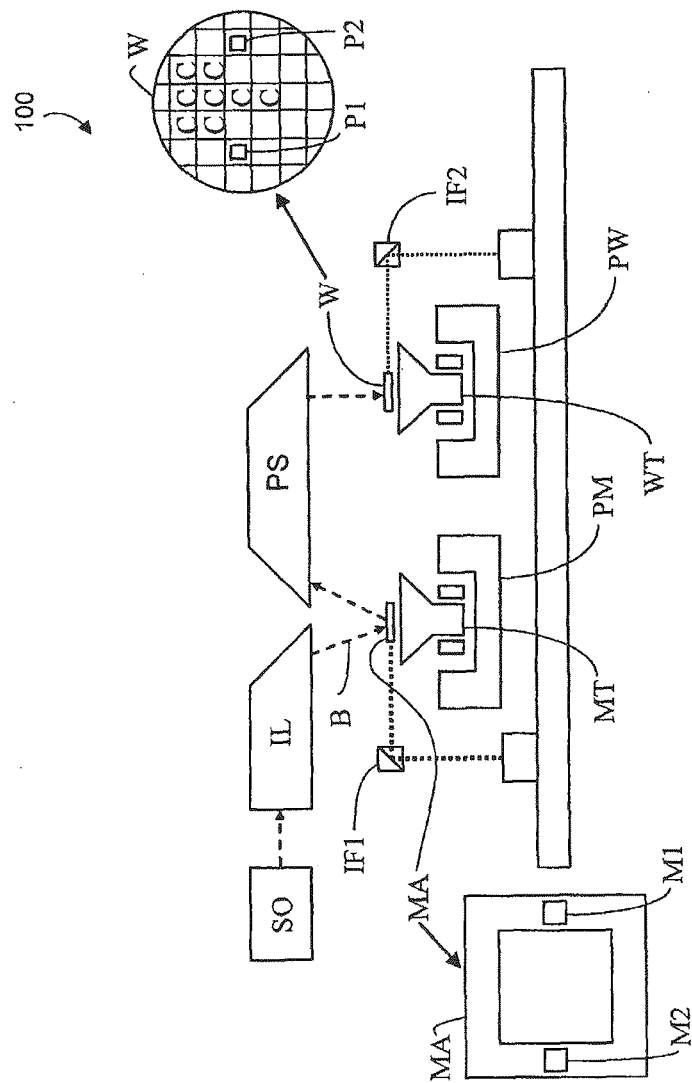
Figure 1B:
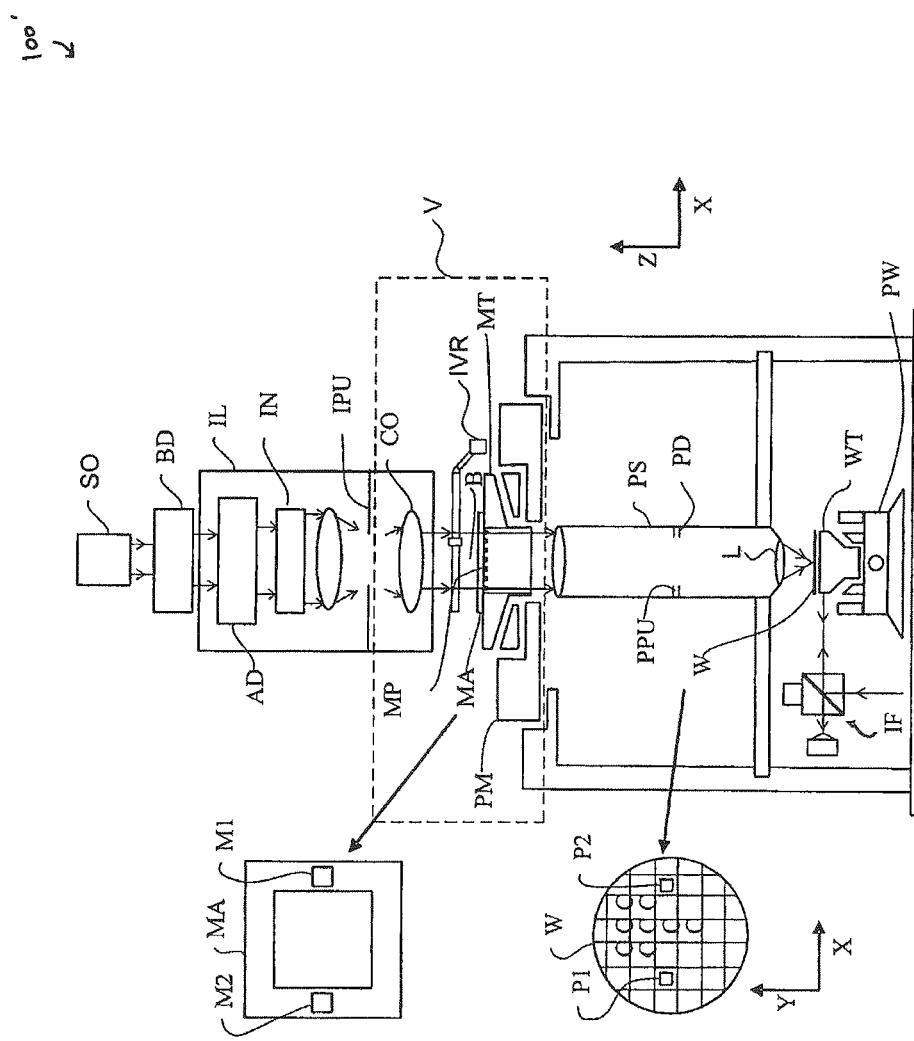

FIGS. 1A and 1B schematically depict lithographic apparatus 100 and lithographic apparatus 100', respectively. Lithographic apparatus 100 and lithographic apparatus 100' each include: an illumination system (illuminator) IL configured to condition a radiation beam B (e.g., DUV or EUV radiation) provided by a source SO; a support structure (e.g., a mask table) MT configured to support a patterning device (e.g., a mask, a reticle, or a dynamic patterning device) MA and connected to a first positioner PM configured to accurately position the patterning device MA; and a substrate table (e.g., a wafer table) WT configured to hold a substrate (e.g., a resist coated wafer) W and connected to a second positioner PW configured to accurately position the substrate W. Lithographic apparatuses 100 and 100' also have a projection system PS configured to project a pattern imparted to the radiation beam B by patterning device MA onto a target portion (e.g., comprising one or more dies) C of the substrate W. In lithographic apparatus 100 the patterning device MA and the projection system PS are reflective, and in lithographic apparatus 100' the patterning device MA and the projection system PS are transmissive.

The illumination system IL can include various types of optical components, such as refractive, reflective, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA, the design of the lithographic apparatuses 100 and 100', and other conditions, such as for example whether or not the patterning device MA is held in a vacuum environment. The support structure MT can use mechanical, vacuum, electrostatic or other clamping techniques to hold the patterning device MA. The support structure MT can be a frame or a table, for example, which can be fixed or movable, as required. The support structure MT can ensure that the patterning device is at a desired position, for example with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C, such as an integrated circuit.

The patterning device MA can be transmissive (as in lithographic apparatus 100' of FIG. 1B) or reflective (as in lithographic apparatus 100 of FIG. 1A). Examples of patterning devices MA include reticles, masks, programmable mirror arrays, and programmable LCD panels. Masks are well known in lithography, and include mask types such as binary, alternating phase shift, and attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B which is reflected by the mirror matrix.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid or the use of a vacuum. A vacuum environment can be used for EUV or electron beam radiation since other gases can absorb, respectively, too much radiation or too many electrons. A vacuum environment can therefore be provided to the whole beam path with the aid of a vacuum wall and vacuum pumps.

Lithographic apparatus 100 and/or lithographic apparatus 100' can be of a type having two (dual stage) or more substrate tables (and/or two or more mask tables) WT. In such "multiple stage" machines the additional substrate tables WT can be used in parallel, or preparatory steps can be carried out on one or more tables while one or more other substrate tables WT are being used for exposure.

Referring to FIGS. 1A and 1B, the illuminator IL receives a radiation beam from a radiation source SO. The source SO and the lithographic apparatuses 100, 100' can be separate entities, for example when the source SO is an excimer laser. In such cases, the source SO is not considered to form part of the lithographic apparatuses 100 or 100', and the radiation beam B passes from the source SO to the illuminator IL with the aid of a beam delivery system BD (FIG. 1B) comprising, for example, suitable directing mirrors and/or a beam expander. In other cases, the source SO can be an integral part of the lithographic apparatuses 100, 100'—for example when the source SO is a mercury lamp. The source SO and the illuminator IL, together with the beam delivery system BD, if required, can be referred to as a radiation system.

The illuminator IL can comprise an adjuster AD (FIG. 1B) for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components (FIG. 1B), such as an integrator IN and a condenser CO. The illuminator IL can be used to condition the radiation beam B, to have a desired uniformity and intensity distribution in its cross section.

Referring to FIG. 1A, the radiation beam B is incident on the patterning device (e.g., mask) MA, which is held on the support structure (e.g., mask table) MT, and is patterned by the patterning device MA. In lithographic apparatus 100, the radiation beam B is reflected from the patterning device (e.g., mask) MA. After being reflected from the patterning device (e.g., mask) MA, the radiation beam B passes through the projection system PS, which focuses the radiation beam B onto a target portion C of the substrate W. With the aid of the second positioner PW and position sensor IF2 (e.g., an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the patterning device (e.g., mask) MA with respect to the path of the radiation beam B. Patterning device (e.g., mask) MA and substrate W can be aligned using mask alignment marks M1, M2 and substrate alignment marks P1, P2.

Referring to FIG. 1B, the radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1B) can be used to accurately position the mask MA with respect to the path of the radiation beam B, e.g., after mechanical retrieval from a mask library, or during a scan.

In general, movement of the mask table MT can be realized with the aid of a long-stroke module (coarse positioning) and a short-stroke (SS) module (fine positioning), which form part of the first positioner PM. Similarly, movement of the substrate table WT can be realized using a long-stroke module and a short-stroke module, which form part of the second positioner PW. In the case of a stepper (as opposed to a scanner) the mask table MT can be connected to a short-stroke actuator only, or can be fixed. Mask MA and substrate W can be aligned using mask alignment marks M1, M2 and substrate alignment marks P1, P2. Although the substrate alignment marks as illustrated occupy dedicated target portions, they can be located in spaces between target portions (known as scribe-lane alignment marks). Similarly, in situations in which more than one die is provided on the mask MA, the mask alignment marks can be located between the dies.

The lithographic apparatuses 100 and 100' can be used in at least one of the following modes:

1. In step mode, the support structure (e.g., mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.

2. In scan mode, the support structure (e.g., mask table) MT and the substrate table WT are scanned synchronously while a pattern imparted to the radiation beam B is projected onto a target portion C (i.e., a single dynamic exposure). The velocity and direction of the substrate table WT relative to the support structure (e.g., mask table) MT can be determined by the (de-)magnification and image reversal characteristics of the projection system PS.

3. In another mode, the support structure (e.g., mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to herein.

Combinations and/or variations on the described modes of use or entirely different modes of use can also be employed.

Although specific reference can be made in this text to the use of lithographic apparatus in the manufacture of ICs, it should be understood that the lithographic apparatus described herein can have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein can be considered as synonymous with the more general terms "substrate" or "target portion," respectively. The substrate referred to herein can be processed, before or after exposure, in for example a track (a tool that typically applies a layer of resist to a substrate and develops the exposed resist), a metrology tool and/or an inspection tool. Where applicable, the disclosure herein can be applied to such and other substrate processing tools. Further, the substrate can be processed more than once, for example in order to create a multi-layer IC, so that the term substrate used herein can also refer to a substrate that already contains multiple processed layers.

In a further embodiment, lithographic apparatus 100 includes an extreme ultraviolet (EUV) source, which is configured to generate a beam of EUV radiation for EUV lithography. In general, the EUV source is configured in a radiation system (see below), and a corresponding illumination system is configured to condition the EUV radiation beam of the EUV source.

B. Example EUV Lithographic Apparatus

Figure 2:
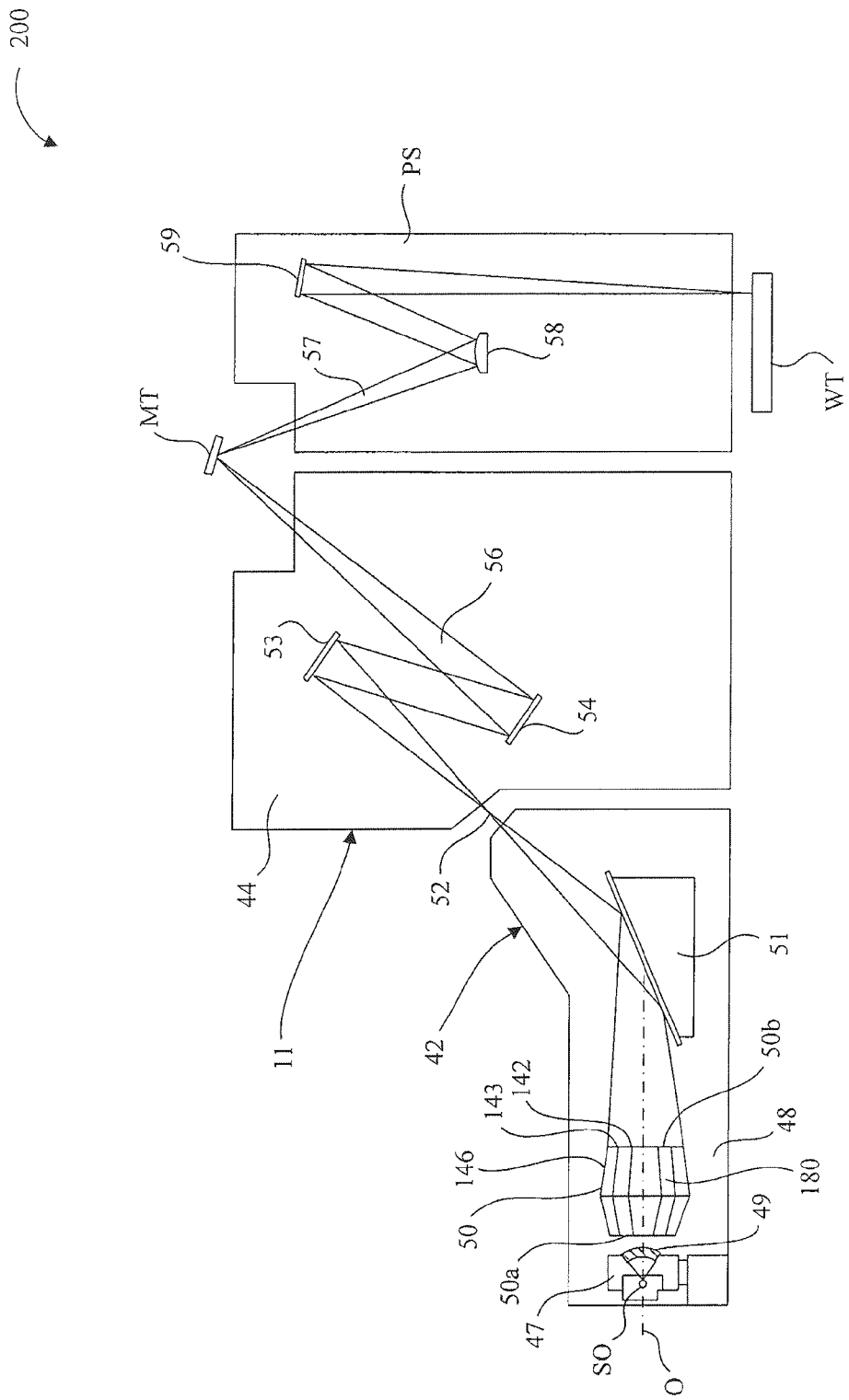
FIG. 2 depicts an example EUV lithographic apparatus.

FIG. 2 schematically depicts an exemplary EUV lithographic apparatus 200 according to an embodiment of the present invention. In FIG. 2, EUV lithographic apparatus 200 includes a radiation system 42, an illumination optics unit 44, and a projection system PS. The radiation system 42 includes a radiation source SO, in which a beam of radiation can be formed by a discharge plasma. In an embodiment, EUV radiation can be produced by a gas or vapor, for example, from Xe gas, Li vapor, or Sn vapor, in which a very hot plasma is created to emit radiation in the EUV range of the electromagnetic spectrum. The very hot plasma can be created by generating at least partially ionized plasma by, for example, an electrical discharge. Partial pressures of, for example, 10 Pa of Xe, Li, Sn vapor or any other suitable gas or vapor can be required for efficient generation of the radiation. The radiation emitted by radiation source SO is passed from a source chamber 47 into a collector chamber 48 via a gas barrier or contaminant trap 49 positioned in or behind an opening in source chamber 47. In an embodiment, gas barrier 49 can include a channel structure.

Collector chamber 48 includes a radiation collector 50 (which can also be called a collector mirror or a collector) that can be formed from a grazing incidence collector. Radiation collector 50 has an upstream radiation collector side 50a and a downstream radiation collector side 50b, and radiation passed by collector 50 can be reflected off a grating spectral filter 51 to be focused at a virtual source point 52 at an aperture in the collector chamber 48.

From collector chamber 48, a beam of radiation 56 is reflected in illumination optics unit 44 via normal incidence reflectors 53 and 54 onto a reticle or mask (not shown) positioned on reticle or mask table MT. A patterned beam 57 is formed, which is imaged in projection system PS via reflective elements 58 and 59 onto a substrate (not shown) supported on wafer stage or substrate table WT. In various embodiments, illumination optics unit 44 and projection system PS can include more (or fewer) elements than depicted in FIG. 2. For example, grating spectral filter 51 can optionally be present, depending upon the type of lithographic apparatus. Further, in an embodiment, illumination optics unit 44 and projection system PS can include more mirrors than those depicted in FIG. 2. For example, projection system PS can incorporate one to four reflective elements in addition to reflective elements 58 and 59. In FIG. 2, reference number 180 indicates a space between two reflectors, e.g., a space between reflectors 142 and 143.

In an embodiment, collector minor 50 can also include a normal incidence collector in place of or in addition to a grazing incidence mirror. Further, collector mirror 50, although described in reference to a nested collector with reflectors 142, 143, and 146, is herein further used as example of a collector.

Further, instead of a grating 51, as schematically depicted in FIG. 2, a transmissive optical filter can also be applied. Optical filters transmissive for EUV, as well as optical filters less transmissive for or even substantially absorbing UV radiation, are known to skilled artisans. Hence, the use of "grating spectral purity filter" is herein further indicated interchangeably as a "spectral purity filter," which includes gratings or transmissive filters. Although not depicted in FIG. 2, EUV transmissive optical filters can be included as additional optical elements, for example, configured upstream of collector mirror 50 or optical EUV transmissive filters in illumination unit 44 and/or projection system PS.

The terms "upstream" and "downstream," with respect to optical elements, indicate positions of one or more optical elements "optically upstream" and "optically downstream," respectively, of one or more additional optical elements. Following the light path that a beam of radiation traverses through lithographic apparatus 200, a first optical element closer to source SO than a second optical element is configured upstream of the second optical element; the second optical element is configured downstream of the first optical element. For example, collector mirror 50 is configured upstream of spectral filter 51, whereas optical element 53 is configured downstream of spectral filter 51.

All optical elements depicted in FIG. 2 (and additional optical elements not shown in the schematic drawing of this embodiment) can be vulnerable to deposition of contaminants produced by source SO, for example, Sn. Such can be the case for the radiation collector 50 and, if present, the spectral purity filter 51. Hence, a cleaning device can be employed to clean one or more of these optical elements, as well as a cleaning method can be applied to those optical elements, but also to normal incidence reflectors 53 and 54 and reflective elements 58 and 59 or other optical elements, for example additional mirrors, gratings, etc.

Radiation collector 50 can be a grazing incidence collector, and in such an embodiment, collector 50 is aligned along an optical axis O. The source SO, or an image thereof, can also be located along optical axis O. The radiation collector 50 can comprise reflectors 142, 143, and 146 (also known as a "shell" or a Wolter-type reflector including several Wolter-type reflectors). Reflectors 142, 143, and 146 can be nested and rotationally symmetric about optical axis O. In FIG. 2, an inner reflector is indicated by reference number 142, an intermediate reflector is indicated by reference number 143, and an outer reflector is indicated by reference number 146. The radiation collector 50 encloses a certain volume, i.e., a volume within the outer reflector(s) 146. Usually, the volume within outer reflector(s) 146 is circumferentially closed, although small openings can be present.

Reflectors 142, 143, and 146 respectively can include surfaces of which at least portion represents a reflective layer or a number of reflective layers. Hence, reflectors 142, 143, and 146 (or additional reflectors in the embodiments of radiation collectors having more than three reflectors or shells) are at least partly designed for reflecting and collecting EUV radiation from source SO, and at least part of reflectors 142, 143, and 146 can not be designed to reflect and collect EUV radiation. For example, at least part of the back side of the reflectors can not be designed to reflect and collect EUV radiation. On the surface of these reflective layers, there can in addition be a cap layer for protection or as optical filter provided on at least part of the surface of the reflective layers.

The radiation collector 50 can be placed in the vicinity of the source SO or an image of the source SO. Each reflector 142, 143, and 146 can comprise at least two adjacent reflecting surfaces, the reflecting surfaces further from the source SO being placed at smaller angles to the optical axis O than the reflecting surface that is closer to the source SO. In this way, a grazing incidence collector 50 is configured to generate a beam of (E)UV radiation propagating along the optical axis O. At least two reflectors can be placed substantially coaxially and extend substantially rotationally symmetric about the optical axis O. It should be appreciated that radiation collector 50 can have further features on the external surface of outer reflector 146 or further features around outer reflector 146, for example a protective holder, a heater, etc.

In the embodiments described herein, the terms "lens" and "lens element," where the context allows, can refer to any one or combination of various types of optical components, comprising refractive, reflective, magnetic, electromagnetic and electrostatic optical components.

Further, the terms "radiation" and "beam" used herein encompass all types of electromagnetic radiation, comprising ultraviolet (UV) radiation (e.g., having a wavelength λ of 365, 248, 193, 157, or 126 nm), extreme ultra-violet (EUV or soft X-ray) radiation (e.g., having a wavelength in the range of approximately 5-20 nm, e.g., 13.5 nm), or hard X-ray working at less than 5 nm, as well as particle beams, such as ion beams or electron beams. Generally, radiation having wavelengths between about 780-3000 nm (or larger) is considered IR radiation. UV refers to radiation with wavelengths of approximately 100-400 nm. Within lithography, it is usually also applied to the wavelengths, which can be produced by a mercury discharge lamp: G-line 436 nm; H-line 405 nm; and/or I-line 365 nm. Vacuum UV, or VUV (i.e., UV absorbed by air), refers to radiation having a wavelength of approximately 100-200 nm. Deep UV (DUV) generally refers to radiation having wavelengths ranging from about 126 nm to about 428 nm, and in an embodiment, an excimer laser can generate DUV radiation used within lithographic apparatus. It should be appreciated that radiation having a wavelength in the range of, for example, about 5-20 nm relates to radiation with a certain wavelength band, of which at least a part is in the range of about 5-20 nm.

III. Dual Containment Fluid Transport System

Disclosed are systems and methods for a dual containment fluid transportation system that can be used in conjunction with the lithographic devices described herein. In an example, the composite fluid transportation system has a two flexible tubes, with the second tube is located inside the first tube. A standoff separates an inner wall of the first tube from an outer wall of the second tube. The tubes are configured such that a fluid in the first tube isolates a fluid in the second tube from an ambient environment.

Unlike conventional devices, the dual containment fluid transportation devices described herein are flexible. Thus, they are not prone to premature failure due to stiffness, and are suitable for applications having millions of movements. The flexibility of the dual containment fluid transportation system also provides a kink-free minimum bend radius less than that of conventional devices. The dual containment fluid transportation system is also lighter, less voluminous, and less expensive to fabricate than conventional devices. Further, the dual containment fluid transportation system is also compatible with standard ultra-high purity (UHP) fittings.

FIG. 3A depicts an example composite dual-lumen tube assembly 300. The dual-lumen tube assembly 300 is a part of the dual containment fluid transportation, and transports at least one fluid. The dual-lumen tube assembly 300 has a flexible outer tube 305. The outer tube 305 transports a first fluid, for example, a non-reactive fluid such as nitrogen gas ($N_2$). The outer tube can be fabricated from minimally-reactive material, for example, polyeurethane (PUR), which has withstands dynamic forces of the rolling loop and provides support for the dual-lumen tube assembly 300.

The dual-lumen tube assembly 300 can also transport a second fluid in a flexible inner tube 310 that is located within the outer tube 305. The inner tube 310 is more flexible than the outer tube 305. The outer tube can be fabricated from minimally-reactive material, for example, polytetraflouroethylene (PTFE), which is used for vacuum and ultra-high purity (UHP) systems. In an example, the inner tube 310 transports a hazardous substance, such as hydrogen gas ($H_2$). When the inner tube 310 transports a second fluid, the first fluid isolates the second fluid from an ambient environment outside of the outer tube. In a further example, the first and second fluids can be the same fluids. In a further example, the outer tube 305 can contain air.

The dual-lumen tube assembly 300 has at least one standoff 315. The standoff is located between the inner wall 320 of the outer tube 305 and the outer wall 325 of the inner tube 310. In an example, the standoff 315 and the inner tube 310 are a unitary structure formed by extrusion of a polymer. The standoff 315 extends substantially radially from the outer wall 325 of the inner tube 310. The standoff 315 also extends along at least a part of the outer wall 325 of the inner tube 310, and can extend substantially parallel to the center of the inner tube 310. The standoff 315 can have any shape suitable to perform the functions described herein, and is not limited to the shape illustrated in FIG. 3A.

The standoff 315 centers the inner tube 310 within the outer tube 305, provides stiffness for the inner tube 310, and maintains a fluid flowpath in the outer tube 305. The standoff 315 also keeps the outer tube 305 from kinking when the dual-lumen tube assembly 300 is flexed. The standoff 315 can also keep the outer wall of the inner tube 310 from abrading the inner wall 320 of the outer tube 305. A face 330 of the standoff 315 has a sliding fit or a clearance fit with the inner wall 320 of the outer tube 305 to reduce friction and stress during flexing of the dual-lumen tube assembly 300. Using a standoff formed from PTFE provides sufficient lubricity to prevent excessive wear during flexing of the dual-lumen tube assembly 300.

FIG. 3B depicts an example cross-section 340 of the dual-lumen tube assembly 300. The cross section 340 shows the inner wall 320 of the outer tube 305, the inner tube 310, and the standoff 315. In this example, the standoff 315 is an integral part of the inner tube 310, and extends substantially radially from the outer wall 325 of the inner tube 310.

FIG. 3C depicts another example cross-section 370 of the dual-lumen tube assembly 300. The cross section 370 shows the outer wall 325 of the inner tube 310 and the standoff 315. In this example, the standoff 315 is not an integral part of the inner tube 310.

FIG. 3D depicts another example composite dual-lumen tube assembly 300. In this example, the standoff 315 is an integral part of the outer tube 305, and extends substantially radially inward from the inner wall 320 of the outer tube 305 toward the outer wall 325 of the inner tube 310.

FIG. 3E depicts another example composite dual-lumen tube assembly 300. In this example, the standoff 315 is an integral part of the inner tube 310. As shown in FIG. 3E, the standoff 315 defines separate channels 392 within the standoff 315. A clearance fit between the standoff 315 and the inner wall 320 of the outer tube 305 defines a space 394. When a differential pressure is applied across the outer tube 305, the first fluid can flow though the channels 392. The first fluid can also flow through the space 394.

FIG. 3F depicts another example composite dual-lumen tube assembly 300. In this example, the dual-lumen tube assembly comprises a single structure in which the standoff 315 is integral to both the inner and outer tubes. This structure defines a space 392 between the inner wall 320 of the outer tube and the outer wall 325 of the inner tube.

FIG. 4 depicts an example of a dual-containment fluid transportation assembly 400 that transports at least one fluid between two relatively moving points. The fluid transportation assembly 400 has at least one dual-lumen tube assembly 300 arranged in a rolling loop 405. An inner radius of the rolling loop 405 is greater than a minimum bend radius of the outer tube 305 and the inner tube 310. When using more than one dual-lumen tube assembly 300, the dual-lumen tube assemblies 300 are fastened together into a tube slab 410. In an example, the tubes in the tube slab 410 are fastened substantially parallel to each other such that fluids in their respective outer tubes do not commingle, as shown in FIG. 4. The tube slab 410 enhances resistance to kinking and collapsing of the dual-lumen tube assemblies 300.

In an example, one end of the rolling loop 405 terminates at an end that is fixed relative to the earth, and the other end of the rolling loop terminates at a moving end. The rolling loop 405 can be oriented such that a radius of the rolling loop 405 is substantially coplanar with a direction of the relative linear motion between the fixed end and the moving end. The radius can also be substantially perpendicular to the plane of motion. A distribution device 415 can be located at either the fixed or moving ends of the rolling loop 405, or at both ends of the rolling loop 405 to anchor the dual-lumen tube assembly 300. The distribution device 415 also adapts the dual-lumen tube assembly 300 to other tubing, such as single-containment tubing. In an embodiment, two tube slabs 410 can be used, each with a respective rolling loop. The two tube slabs 410 can be mirrored about a plane substantially perpendicular to a direction of relative motion between the fixed and moving ends.

When there is relative motion between the fixed and moving ends, the rolling loop 405 rolls to provide the relative motion between the fixed and moving sides. As an example, the orientation shown in FIG. 4 represents a center of the range of motion, with equal movement in both directions indicated. Unequal movement relative to a resting point of the rolling loop can also used. While rolling, the standoff 315 keeps the outer tube 305 from flexing to a point where the outer tube 305 kinks, and keeps the inner tube 310 from kinking. The standoff 315 also maintains flowpaths in both the inner tube 310, and in a space between the outer wall 325 and the inner wall 320. A first differential pressure between two points in the inner tube 310 causes fluid flow in the inner tube 310, and a second differential pressure between the two points in the outer tube 305 causes fluid flow in the outer tube 305. Monitoring a fluid pressure and flow in the outer tube 305 detects a breach of the inner tube 310 and the outer tube 305. For example, when a liquid flows through the inner tube 310, and a sensor 420 monitors the volume of the outer tube 305, a leak can be detected without the liquid in the inner tube 310 reaching the ambient environment.

FIG. 5 depicts an example of a distribution device 500 adapting the dual-lumen tube assembly 300 to single containment tubing, such as a rigid tube. The distribution device 500 adapts at least one dual-lumen tube assembly 300 and is not limited to adapting only two dual-lumen tube assemblies 502A, 502B, as illustrated in FIG. 5. The two dual-lumen tube assemblies 502A, 502B illustrated in FIG. 5 are separate dual-lumen tube assemblies 300, and are described herein with reference to the dual-lumen tube assembly 300.

The distribution device 500 has an inner fluid port 505 coupled to an inner tube manifold 510. The inner fluid port 505 is coupled to a first single-containment tube via a fitting. The inner tube manifold 510 is coupled to an inner tube 310 of the dual-lumen tube assembly 300 via at least one inner tube fitting. These connections provide gas-tight containment between the first single-containment tube and the inner tube 310.

The distribution device 500 also has an outer fluid port 515 that is coupled to a chamber 520 defined by the distribution device 500. The outer fluid port 515 is coupled to a second single-containment tube via a fitting. At least a part of the inner tube manifold 510 is located in the chamber 520. The chamber 520 is also coupled to a respective outer tube 305 of the dual-lumen tube assembly 300 via at least one outer tube fitting. The outer tube fitting can be substantially coaxial with the inter tube fitting. These connections provide gas-tight containment between the second single-containment tube and the outer tube 305.

In use, the distribution device 500 adapts each dual-lumen tube assembly 300 to a pair of single containment tubes, while providing dual containment within the distribution device 500. A differential pressure between the first single-containment tube and the inner tube fitting causes fluid flow through the inner tube manifold 510. A differential pressure between the second single-containment tube and the outer tube fitting causes fluid flow through the chamber 520.

FIG. 6A depicts an example of a distribution device 600 adapting the dual-lumen tube assembly 300 to single containment tubing, such as rigid tubing. The distribution device 600 adapts at least one dual-lumen tube assembly 300, and is not limited to adapting only two dual-lumen tube assemblies 602A, 602B, as illustrated in FIG. 6A. The two dual-lumen tube assemblies 602A, 602B illustrated in FIG. 6A are separate dual-lumen tube assemblies 300, and are described herein with reference to the dual-lumen tube assembly 300.

The distribution device 600 has an inner fluid port 605 that is coupled to an inner tube manifold 610. The inner fluid port 605 is coupled to a single-containment tube via a fitting. The inner tube manifold 610 is also coupled to a respective inner tube 310 of the dual-lumen tube assembly 300 via an inner tube fitting. For example, as shown in FIG. 6A, the inner tube manifold 610 is coupled to a first inner tube 603A of a first dual-lumen tube assembly 602A via a barbed inner tube fitting, and coupled to a second inner tube 603B of a second dual-lumen tube assembly 602B via a second barbed inner tube fitting. These connections provide gas-tight containment between the inner fluid port 605 and the inner tubes 603A, 603B.

The distribution device 600 also has a chamber 615 defined by the distribution device 600. At least a part of the inner tube manifold 610 is located in the chamber 615. The chamber 615 is coupled to outer tubes 604A, 604B of the dual-lumen tube assemblies 602A, 602B via outer tube fittings. For example, as shown in FIG. 6, the chamber 615 is coupled to a first outer tube 604A of a first dual-lumen tube assembly 602A via an outer tube fitting, and a second outer tube 604B of a second dual-lumen tube assembly 602B via a second outer tube fitting. The outer tube fitting can be substantially coaxial with the inter tube fitting. These connections provide gas-tight containment between the chamber 615 and the outer tubes 604A, 604B. In an example, the distribution device 600 has a removable orifice 620 to vent fluid in the chamber 615 beyond an exterior of the distribution device 600 to regulate pressure in the outer tubes 604A, 604B. FIG. 6B depicts an exemplary schematic diagram of fluid paths within an example of the distribution device 600.

The distribution device 600 adapts each dual-lumen tube assembly 300 to a single containment tube for one fluid, while venting the other fluid and providing dual containment within the distribution device 600. A differential pressure between the inner fluid port 605 and the inner tubes 603A, 603B causes fluid flow through the inner tube manifold 610. A differential pressure between the outer tubes 604A, 604B and the exterior of the distribution device 600 causes fluid flow through the chamber 615.

FIG. 6B depicts a schematic 650 of an exemplary embodiment of a dual containment fluid transport system. The illustrated system includes the distribution device 500, the rolling loop 405, and the distribution device 600. The schematic 650 shows fluid flow through the distribution device 500, the rolling loop 405, and the distribution device 600.

FIG. 6C depicts another embodiment of the distribution device 600. This structure is similar to that illustrated in FIGS. 6A and 6B. Unlike the device of FIG. 6A, however, the device of FIG. 6C provides a single, flexible, dual-lumen tube assembly 675 of any length, that positions the inner fluid port 605 at a remote location, such as the short stroke stage. In this embodiment, the fluid in the chamber 615 (see FIG. 6A) is vented at the remote location from an orifice 620. The assembly 675 is connected to the rest of the assembly 600 by a standard 12×10 tube fitting 635. The assembly 675 is connected to the inner fluid port 605 and the orifice 620 by standard sealing structures 625 and a barbed inner tube fitting 630.

FIG. 6D depicts a schematic of an exemplary embodiment of a dual containment fluid transport system 670. System 670 includes the distribution device 500, the rolling loop 405, and the distribution device 600 according to the embodiment depicted in FIG. 6C including the assembly 675 and remote orifice 620. The system 670 shows an example of fluid flow through the distribution device 500, the rolling loop 405, and the distribution device 600, and the assembly 675 including venting of fluid from the remote orifice 620.

FIG. 7 depicts a flowchart of an exemplary method 700 for communicating two fluids using the apparatus disclosed herein. For example, a first fluid is communicated via a first flexible tube having a first end, a second end, and an inner wall. A second fluid is communicated via a second flexible tube having a first end, a second end, and an outer wall. At least one standoff locates the first and second tubes relative to each other by separating the outer wall of the second tube from the inner wall of the first tube.

In step 710, a first differential pressure is created between first and second ends of the first tube. In step 720, a second differential pressure is created between first and second ends of the second tube. In step 730, a first end of the first tube is moved relative to a second end of the first tube. The moving can be repetitive between two substantially similar locations. In an example, the first and second tubes can be arranged in a rolling loop to save space and weight. In step 740, the first fluid is vented beyond the exterior of the first tube. The first fluid can be vented via an orifice in a chamber to which the first tube is attached. Further, in step 750, the first fluid can be monitored to determine if the first or second tubes are leaking. In step 760, the second fluid is passed through a connection that directs the first second to another location.

IV. Conclusion

It is to be appreciated that the Summary and Abstract sections, as well as the Title, are not intended to limit the present invention and the claims. The Summary and Abstract sections may set forth one or more but not all exemplary embodiments of the present invention as contemplated by the inventor(s), and thus, are not intended to limit the present invention and the appended claims in any way.

The present invention has been described herein with the aid of functional building blocks illustrating the implementation of specified functions and relationships thereof The boundaries of these functional building blocks have been arbitrarily defined herein for the convenience of the description. Alternate boundaries can be defined so long as the specified functions and relationships thereof are appropriately performed.

The foregoing description of specific embodiments fully reveals the general nature of the present invention so that others can, by applying knowledge within the skill of the art, readily modify and/or adapt such specific embodiments for various applications, without undue experimentation, and without departing from the general concept of the present invention. Therefore, such modifications and adaptations are intended to be within the meaning and range of equivalents of the disclosed embodiments, based on the teaching and guidance presented herein. The phraseology or terminology herein is for the purpose of description and not of limitation, such that the phraseology or terminology of this specification is to be interpreted by the skilled artisan in light of the teachings and guidance.

The breadth and scope of the present invention should not be limited by any of the above-described exemplary embodiments, but should be defined only in accordance with the claims and their equivalents.

What is claimed is:

1. A fluid transportation system comprising:
   a first flexible tube having an inner wall and configured to transport a first fluid;
   a second flexible tube having an outer wall and configured to transport a second fluid, wherein the second tube is located inside the first tube;
   a standoff located between the inner wall of the first tube and the outer wall of the second tube;
   a distribution device comprising:
      a chamber comprising chamber walls that are configured to define a path for a flow of the first fluid through the distribution device, wherein the second end of the first flexible tube is coupled to the chamber and the first flexible tube is located external to the chamber,
      a first fluid port configured to provide an opening for the first fluid to enter the chamber, and a second fluid port, located external to the first fluid port, configured to provide an opening for the second fluid to enter the second flexible tube; and a manifold including:
- a first portion that is located inside the chamber, wherein the second end of the second flexible tube is coupled to the manifold and the second flexible tube is located external to the chamber; and
- a second portion that is located outside the chamber.

2. The system of claim 1, wherein the first and second tubes are configured in a rolling loop.

3. The system of claim 1, wherein the standoff extends substantially radially from the outer wall of the second tube to substantially center the second tube within the first tube.

4. The system of claim 1, wherein the standoff extends from the outer wall of the second tube toward the inner wall of the first tube.

5. The system of claim 1, wherein the standoff is fastened to both the inner wall of the first tube, and the outer wall of the second tube.

6. The system of claim 1, wherein the standoff is integral with the second tube.

7. The system of claim 1, wherein the standoff is integral with the first tube.

8. The system of claim 1, further comprising:
- a third flexible tube having a first end, a second end, and an inner wall configured to transport a third fluid, and fastened to the first tube;
- a fourth flexible tube having a first end, a second end, and an outer wall and configured to transport a fourth fluid, wherein the fourth tube is located inside the third tube; and
- a second standoff located between the inner wall of the third tube and the outer wall of the fourth tube, 9. The system of claim 8, wherein, the manifold is coupled to the second end of the fourth flexible tube, and the second end of the third flexible tube is coupled to the chamber of the distribution device.

10. The system of claim 8, wherein the third flexible tube and the fourth flexible tube are configured such that the third fluid isolates the fourth fluid from an ambient environment.

11. The system of claim 8, wherein the first end of the third flexible tube is configured to move relative to the second end of the third flexible tube.

12. The system of claim 1, wherein the standoff extends along the outer wall of the second tube, substantially parallel with a centerline of the second tube.

13. The system of claim 1, wherein first and second flexible tubes are configured such that monitoring of the first fluid detects a breach of the second tube.

14. The system of claim 1, wherein the first tube is fastened to the second tube.

15. The system of claim 1, further comprising a pressure monitor configured to monitor a fluid pressure in the first tube.

16. A lithographic apparatus comprising the fluid transportation system of claim 1.

17. The system of claim 1, wherein the first end of the first flexible tube is configured to move relative to the second end of the first flexible tube.

18. The system of claim 1, wherein the first flexible tube and the second flexible tube are configured such that the first fluid isolates the second fluid from an ambient environment.

* * * * *

UNITED STATES PATENT AND TRADEMARK OFFICE
CERTIFICATE OF CORRECTION

PATENT NO.        : 9,052,616 B2                                Page 1 of 1
APPLICATION NO.   : 12/915632
DATED             : June 9, 2015
INVENTOR(S)       : Daniel Paul Rodak It is certified that error appears in the above-identified patent and that said Letters Patent is hereby corrected as shown below:

In the Claims
Column 14, line 53, claim 1, after "tube having", please insert --a first end, a second end, and--.
Column 14, line 55, claim 1, after "tube having", please insert --a first end, a second end, and--.
Column 15, line 10, claim 2, after "first and" insert --the--.
Column 15, line 27, claim 8, after "inner wall", please insert --,--.
Column 15, line 28, claim 8, after "first" insert --flexible--.
Column 16, line 16, claim 13, after "wherein", please delete "first and" and insert --the first and the--.

Signed and Sealed this
Second Day of February, 2016

Michelle K. Lee
*Director of the United States Patent and Trademark Office*